(12) United States Patent
Becker et al.

(10) Patent No.: US 7,273,987 B2
(45) Date of Patent: Sep. 25, 2007

(54) FLEXIBLE INTERCONNECT STRUCTURES FOR ELECTRICAL DEVICES AND LIGHT SOURCES INCORPORATING THE SAME

(75) Inventors: Charles Adrian Becker, Schenectady, NY (US); Stanton Earl Weaver, Northville, NY (US); Thomas Elliot Stecher, Scotia, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 10/063,104

(22) Filed: Mar. 21, 2002

(65) Prior Publication Data

US 2003/0179548 A1    Sep. 25, 2003

(51) Int. Cl.
*H05K 1/16* (2006.01)
(52) U.S. Cl. .............. 174/260; 174/252; 362/373
(58) Field of Classification Search ........... 174/252, 174/15.2, 260, 262, 254, 261, 263, 264; 361/760, 361/688, 697, 709, 713; 362/800, 218; 313/46, 313/13
See application file for complete search history.

(56) References Cited

U.S. PATENT DOCUMENTS

| | | | | |
|---|---|---|---|---|
| 4,563,725 A | * | 1/1986 | Kirby | 361/708 |
| 5,095,404 A | * | 3/1992 | Chao | 361/700 |
| 5,285,352 A | * | 2/1994 | Pastore et al. | 361/707 |
| 5,291,064 A | * | 3/1994 | Kurokawa | 257/714 |
| 5,367,434 A | * | 11/1994 | Griffin et al. | 361/719 |
| 5,452,182 A | * | 9/1995 | Eichelberger et al. | 361/749 |
| 5,506,756 A | * | 4/1996 | Haley | 361/789 |
| 5,527,741 A | | 6/1996 | Cole et al. | |
| 5,747,876 A | * | 5/1998 | Majumdar et al. | 257/687 |
| 5,857,767 A | | 1/1999 | Hochstein | |
| 5,920,458 A | * | 7/1999 | Azar | 361/704 |
| 6,201,300 B1 | | 3/2001 | Tseng et al. | |
| 6,310,391 B1 | | 10/2001 | Nagasawa et al. | |
| 6,428,189 B1 | * | 8/2002 | Hochstein | 362/373 |
| 6,517,218 B2 | * | 2/2003 | Hochstein | 362/294 |
| 6,612,717 B2 | * | 9/2003 | Yen | 362/245 |
| 6,936,855 B1 | * | 8/2005 | Harrah | 257/88 |
| 2003/0179548 A1 | | 9/2003 | Becker et al. | |

OTHER PUBLICATIONS

XBright® Power Chip LED CxxxXB900-Sx000-A; Cree, Inc.; 2005-2006; pp. 1-4.

* cited by examiner

*Primary Examiner*—Ishwar (I. B.) Patel
(74) *Attorney, Agent, or Firm*—Fay Sharpe LLP (57) ABSTRACT

A flexible interconnect structure allows for rapid dissipation of heat generated from an electrical device that includes light-emitting elements, such as light-emitting diodes ("LEDs") and/or laser diodes. The flexible interconnect structure comprises: (1) at least one flexible dielectric film on which circuit traces and, optionally, electrical circuit components are formed and at least a portion of which is removed through its thickness; and (2) at least a heat sink attached to one surface of the flexible dielectric film opposite to the surface on which circuit traces are formed. The flexible interconnect structure can include a plurality of such flexible dielectric films, each supporting circuit traces and/or circuit components, and each being attached to another by an electrically insulating layer. Electrical devices or light sources having complex shapes are formed from such flexible interconnect structures and light-emitting elements attached to the heat sinks so to be in thermal contact therewith.

34 Claims, 8 Drawing Sheets

FIG.1

SEC.A-A

FLEXIBLE INTERCONNECT STRUCTURES FOR ELECTRICAL DEVICES AND LIGHT SOURCES INCORPORATING THE SAME

BACKGROUND OF INVENTION

The present invention relates to flexible interconnect structures that support circuits for controlling or operating electrical devices and light sources incorporating the same. In particular, the present invention relates to such flexible interconnect structures and devices that incorporate light-emitting elements and have improved thermal management capability.

Light-emitting diodes ("LEDs") are now widely applied in a variety of signs, message boards, and light sources. The relatively high efficacy of LEDs (in lumens per watt) is the primary reason for their popularity. Large power savings are possible when LED signals are used to replace traditional incandescent signals of similar luminous output. One aspect of LED technology that has not been satisfactorily resolved is the efficient management and removal of waste heat, especially for high optical power LEDs, requiring increased electrical power. The waste heat results in excessive junction temperatures, degrading performance and reducing device life. LED lamps exhibit substantial light output sensitivity to temperature, and can be permanently degraded by excessive temperature. For example, the maximum recommended operating temperature for LEDs that incorporate indium in their compositions is between about 85° C. and about 100° C. These devices can exhibit typical (half brightness) lives on the order of 50,000 to 100,000 hours at 25° C. However, degradation above 90° C. is rapid as the LEDs degrade exponentially with increases in temperature.

Permanent thermal degradation of LEDs may also occur during array fabrication if care is not taken, when the LEDs are soldered to the supporting and/or interconnecting circuit board. For example, typical soldering temperatures can exceed 250° C. and seriously affect the performance of the LEDs even before they are put into service, if the LEDs remain at or near such high temperatures for an extended period of time. Therefore, it is very advantageous to remove heat rapidly from the vicinity of LEDs whether such heat is generated by the LEDs during normal use or applied during the assembly or manufacturing process.

One common method for dissipating heat generated from LEDs that are mounted on an insulating printed circuit board ("PCB"), such as the commonly available FR-4 fiber composite circuit board, is to form a plurality of vias under each LED through the thickness of the PCB. The vias are filled with a metal or alloy having high thermal conductivity and connected to a heat sink attached to the PCB opposite to the LED. However, the formation of such vias adds to the cost of manufacturing the pcb. In addition, the rate of heat dissipation is limited by the rate of heat conduction through the vias because of their typical small cross section.

Another approach is to provide thermally conductive substrates on which electronic components are mounted. These substrates generally perform a function of mechanical support, also provide for electrical interconnection to and between components, and assist in the extraction and dissipation of heat generated by the electronic components. These substrates often are costly or require complicated multi-step manufacturing processes. For example, substrates have been made of thermally conductive ceramics or metals coated or laminated with dielectric materials. Thermally conductive ceramic substrates are costly compared to metals and are, therefore, more appropriately reserved for high temperature applications or for devices the price of which is a secondary concern. When coated or laminated metallic substrates are used, the electrical insulating property of the coating is important. Puncture voltage and dielectric dissipation of the insulating coating directly depend on film thickness, but the rate of heat dissipation inversely depends on the film thickness. Thus, a compromise must be accepted which often results in a less efficient overall device.

Therefore, there exists a continued need to provide interconnect structures for LEDs that allow for rapid heat dissipation and are cost effective and simple to make. In addition, it is also very desirable to provide interconnect structures for LEDs that are mechanically flexible such that devices having substantial curvature are made.

SUMMARY OF INVENTION

A flexible interconnect structure comprises a flexible dielectric film having at least a first surface and a second surface and circuit traces being disposed on at least one of the film surfaces. In addition, one or more electrical circuit components can be disposed on a surface of the dielectric film and connected to at least a circuit trace to form an electrical circuit. Portions of the flexible dielectric film are removed through the thickness of the film. Flexible interconnect structures of the present invention allow for rapid dissipation of heat generated during the fabrication or use of electrical devices which comprise such flexible interconnect structures.

In one aspect of the present invention, an electrical device comprises: (1) a flexible interconnect structure comprising a flexible dielectric film having a first surface and a second surface, electrical circuit components and circuit traces being disposed on at least one of the film surfaces, at least a portion of the flexible dielectric film being removed through the thickness thereof and at least a heat sink attached to one of said film surfaces, said heat sink covering said portion of said flexible film that has been removed and being electrically isolated from said circuit components and at least one of said circuit traces; and (2) at least one light-emitting diode ("LED") or a laser diode ("LD") attached to said at least a heat sink through said portion of said flexible film that has been removed such that said LED or LD is in thermal contact with said heat sink and is electrically connected to at least one of said circuit traces.

In another aspect of the present invention, an electrical device of the present invention is a light source.

In still another aspect of the present invention, a method is provided for making a flexible interconnect structure that allows for a dissipation of heat generated during a fabrication or use of electrical devices which comprise such flexible interconnect structures. The method comprises: (1) providing a flexible dielectric film having a first surface and a second surface; (2) disposing electrical circuit components and circuit traces on at least one of said surfaces; and (3) removing at least a portion of said film through a thickness thereof, said portion being devoid of said circuit components and said circuit traces.

In still another aspect of the present invention, the method further comprises attaching at least a heat sink to one of said surfaces of said flexible dielectric film, said heat sink covering said at least a portion of said film that has been removed.

In still another aspect of the present invention, a method for making an electrical device comprising at least a LED comprises: (1) providing a flexible dielectric film having a first surface and a second surface; (2) disposing electrical circuit components and circuit traces on at least one of said surfaces; (3) removing at least a portion of said film through a thickness thereof, said portion being devoid of said circuit components and said circuit traces; (4) attaching at least a heat sink to one of said surfaces of said flexible dielectric film, said heat sink covering said at least a portion of said film that has been removed and being electrically isolated from said circuit components and at least one of said circuit traces; and (5) attaching at least one LED to said at least a heat sink through said portion of the flexible film that has been removed such that the LED is in thermal contact with the heat sink and is electrically connected to at least one of the circuit traces.

Other features and advantages of the present invention will be apparent from a perusal of the following detailed description of the invention and the accompanying drawings in which the same numerals refer to like elements.

DETAILED DESCRIPTION

As used herein, the term "flexible" means being capable of being bent to a shape that has a radius of curvature of less than about 10 cm, and preferably less than about 1 cm. The terms "electromagnetic radiation" or "light" are used interchangeably. The term "substantially transparent" means allowing at least 80 percent, preferably at least 90 percent, and more preferably at least 95 percent of light transmission. The term "heat sink" means a structure or a component that transports heat away or otherwise removes heat from a heat source.

The flexible interconnect structure of the present invention is equally applicable to devices that include either LEDs, or LDs, or both. Therefore, although a LED is typically shown or referred to, a LD may occupy the same position, depending on the design and purpose of the overall device.

Figure 1:
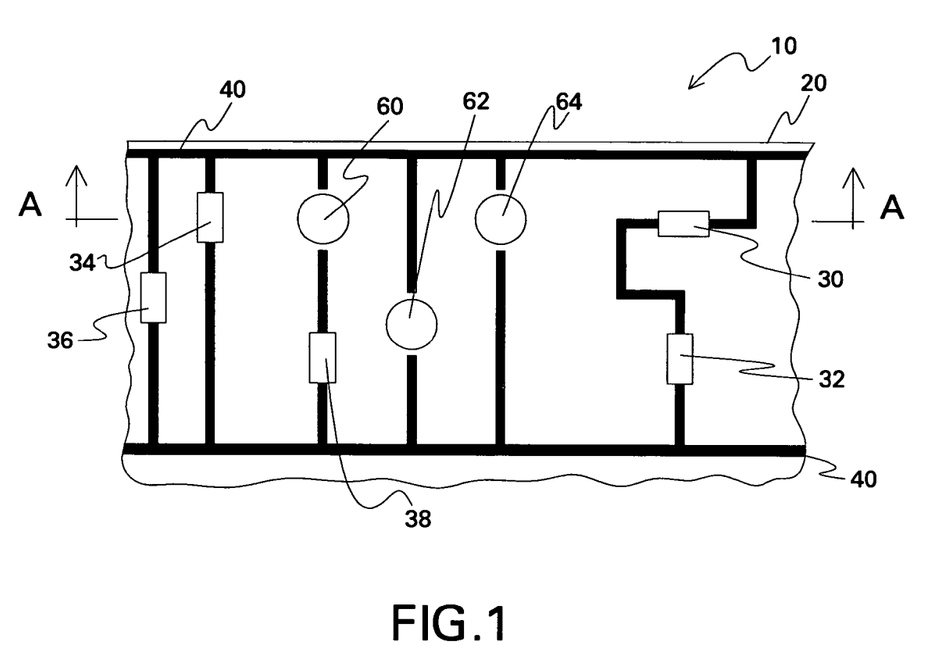
FIG. 1 shows schematically a section of a flexible interconnect structure of the present invention.
Figure 2:
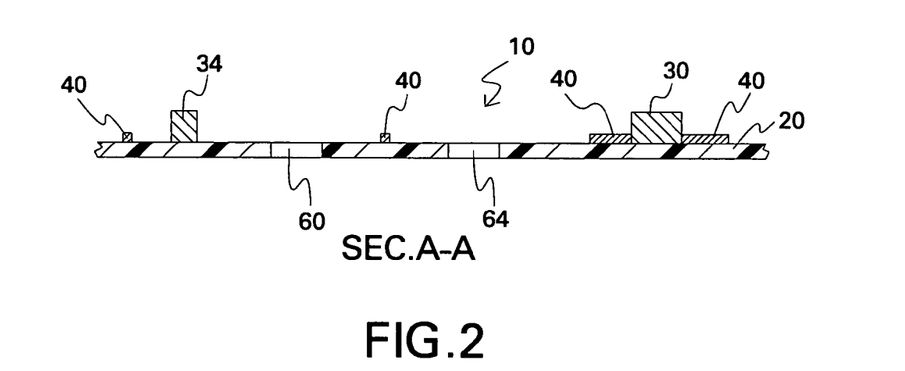
FIG. 2 shows the cross-sectional view of the flexible interconnect structure of FIG. 1 along the cut A-A.

FIG. 1 shows schematically a section of a flexible interconnect structure 10 of the present invention. FIG. 2 is a cross-sectional view of flexible interconnect structure 10 along the cut A-A. It should be understood that the figures shown herein are not drawn to scale. Flexible interconnect structure 10 comprises a flexible dielectric film 20 on which electrical circuit components 30, 32, 34, 36, and 38 and circuit traces 40 are formed or disposed. Although FIGS. 1 and 2 show only five exemplary electrical circuit components 30, 32, 34, 36, and 38, any number of circuit components may be disposed on flexible film 20 as desired. In fact, current microelectronic fabrication technologies can allow for the arrangement of hundreds of such components per square centimeter. Circuit components 30, 32, 34, 36, and 38 may be resistors, capacitors, inductors, power sources, or even integrated circuits, each comprising a multitude of other interrelated electrical or electronic components. Portions 60, 62, and 64 are removed from flexible dielectric film 20 through the thickness thereof. Each of these portions 60, 62, and 64 removed from flexible film 20 is designed to accept a light-emitting element such as a LED or a LD, or a cup for holding a LED or a LD. Therefore, the number, shape, and size of these removed portions depend on the desired application. Typically, a removed portion or hole 60, 62, or 64 has a diameter of about several millimeters and is formed in flexible film 20 at predetermined locations where electrical circuit components and circuit traces are not present. Holes 60, 62, and 64 are formed into flexible dielectric film by a method such as laser drilling, laser cutting, mechanical drilling, punching, or etching.

Figure 3:
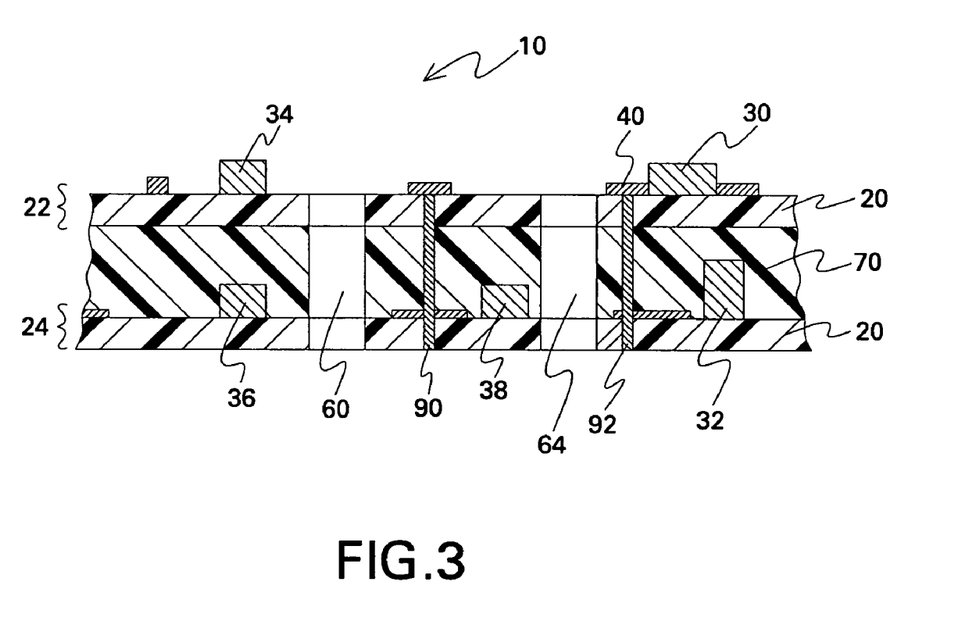
FIG. 3 illustrates a flexible interconnect of the present invention that includes multiple layers supporting electrical circuits.
Figure 4:
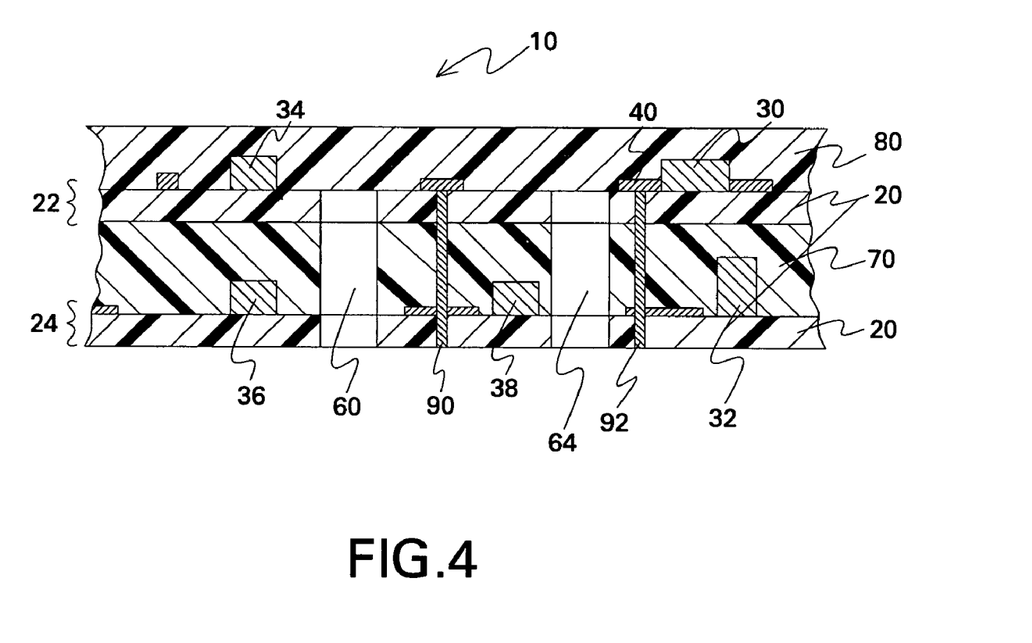
FIG. 4 illustrates another embodiment of the multilayer flexible interconnect of the present invention.

Although FIGS. 1 and 2 show flexible interconnect structure 10 comprising only one film, a flexible interconnect structure of the present invention can comprise a plurality of circuit layers, each comprising a flexible dielectric film supporting circuit traces and/or circuit components. FIG. 3 shows the cross-sectional of an exemplary flexible interconnect structure of the present invention comprising two circuit layers 22 and 24 separated by an electrically insulating separation layer 70 disposed therebetween. In addition, the outermost circuit layer 22 may be desirably protected with a protective layer 80 of an electrically insulating material disposed to cover all of the circuit components and circuit traces, as shown in FIG. 4. The electrical circuits of the different circuit layers 22 and 24 are typically connected together by electrically conducting vias such as vias 90 and 92 formed through the layers at appropriate locations. When a flexible interconnect structure of the present invention comprises a plurality of circuit layers, removed portions or holes are formed through the entire stack of circuit layers.

Dielectric film 20 typically comprises a polymer having a high dielectric constant upon which an electrically conductive material can adhere. The surface of the film on which circuit components and circuit traces are to be disposed or both of its surfaces may be desirably cleaned before a next processing step by exposing such surfaces to a plasma treatment with plasma formed from a gas selected from the group consisting of $N_2$, Ar, Ne, $O_2$, $CO_2$, and $CF_4$. Such a plasma treatment can advantageously provide the surface of film 20 with a better adhesion property for deposition of the next layer thereon, which can be a metallization layer for forming an electrical circuit or a protective layer of another polymer. Appropriate materials for dielectric film 20 include; for example, thermoplastic polymers, acrylic resins, polyester such as Mylar (made by E.I. du Pont de Nemours & Co.); polyimide such as Kapton H or Kapton E (made by du Pont), Apical AV (made by Kanegafugi Chemical Industry Company), Upilex (made by UBE Industries, Ltd.); and polyetherimide such as Ultem (made by General Electric Company). Suitable dielectric film materials need to provide electrical isolation so as to prevent electrical flow across the thickness of the dielectric film.

Protective layer 80 may be made of a material chosen among those disclosed above. Protective layer 80 may comprise the same material as or a different material than that of the flexible film 20. It can be formed by spin coating, spray coating, vacuum chemical deposition using a mixture of precursors of the polymers with a solvent followed by curing. Separation layer 70 typically comprises an organic adhesive such as a siloxane-polyimide-epoxy (SPIE) or a cyanoacrylate. Separation layer 70 also may be formed by spin coating, spray coating, or vacuum chemical deposition followed by curing. A multilayer flexible interconnect structure may be formed by lamination of different layers together. Alternatively, the layers may be formed sequentially one on top another.

Desirable properties for flexible dielectric film 20 include an elastic modulus and coefficients of thermal and humidity expansion that provide minimal dimensional change during processing. To maintain flexibility, the thickness of flexible dielectric film 20 is typically minimized. At the same time, dielectric film 20 must have enough rigidity (due to their thickness or material composition) to support layers of metallization on one or both surfaces and maintain dimensional stability through all subsequent processing steps. Typically, a thickness of film 20 is in the range from about 1 micrometer to about 5 mm.

Electrical circuit components, for example, 30, 32, 34, 36, and 38 and circuit traces 40 are typically formed on a surface of dielectric film 20 by microelectronic manufacturing processes. For example, a metallization layer is first formed on dielectric film 20 by sputtering, dipping, platting, physical vapor deposition, chemical vapor deposition, or direct bonding or lamination of the metal. The metallization layer is then patterned by etching using a photoresist pattern. Alternatively, the circuit components and circuit traces can be built by depositing appropriate materials through a mask, such as a photoresist mask. Certain circuit components such as capacitors and integrated circuits require deposition of more than one layer, each being patterned with a separate mask. The interconnect layer may also be formed by direct printing, screen printing, or pad printing of a conductive ink.

Figure 5:
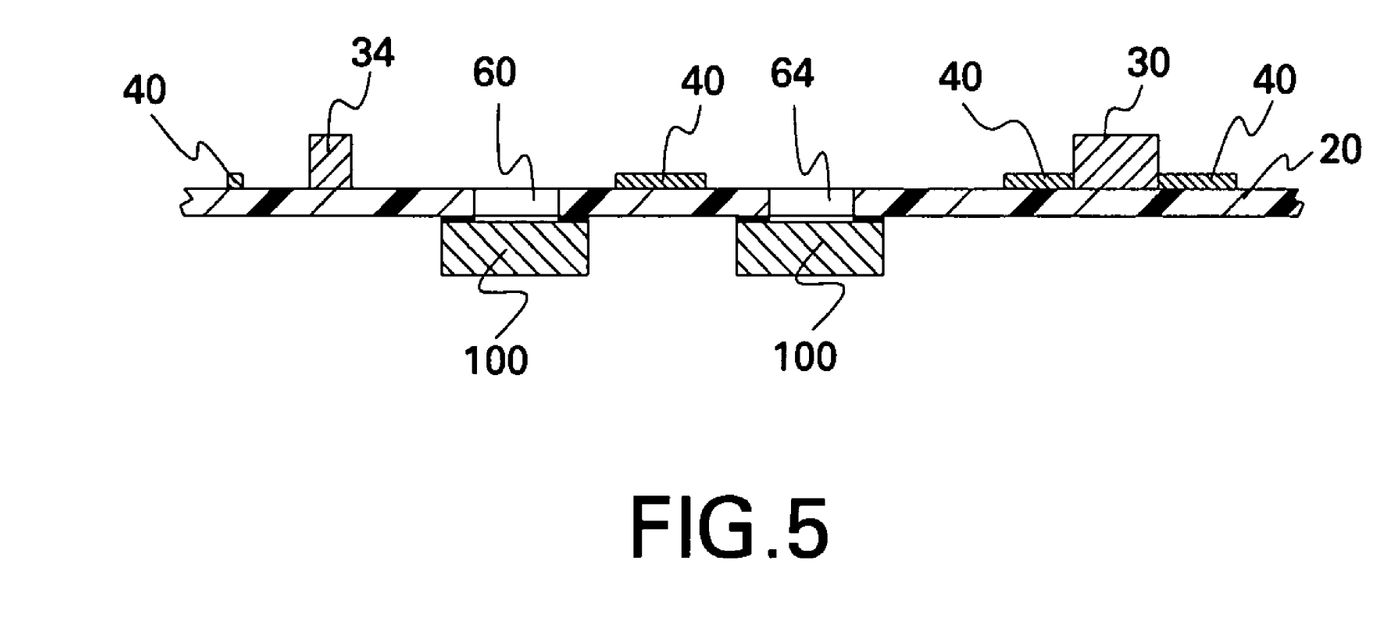
FIG. 5 shows schematically a flexible interconnect including heat sinks.

In one embodiment of the present invention, as shown in FIG. 5, a heat sink 100 is attached to a surface of flexible interconnect structure 10, which surface is typically opposite to the surface on which circuit components and circuit traces are disposed. Each heat sink 100 covers a removed portion or hole (60, 64) formed in the flexible interconnect structure 10 and is typically attached thereto with an electrically insulating adhesive, such as an epoxy. Heat sink 100 comprises a thermally conductive material, such as metals or high-conductivity ceramics; preferably a metal having high thermal conductivity, such as silver, aluminum, or copper. The term "high-conductivity ceramic" means a ceramic having a thermal conductivity greater than about 100 W/m/K. Heat sink 100 may advantageously have a plurality of fins 102 extending away from the flexible interconnect structure 10 to promote rapid dissipation of heat. Alternatively, heat sink 100 is attached to flexible interconnect structure 10 to cover more than one removed portion or hole. In still another embodiment, a sheet of thermally conductive material is attached to flexible interconnect structure 10 to cover substantially its entire surface area. These alternative embodiments of heat sinks 100 provide larger surface areas for heat dissipation by convection.

Figure 10:
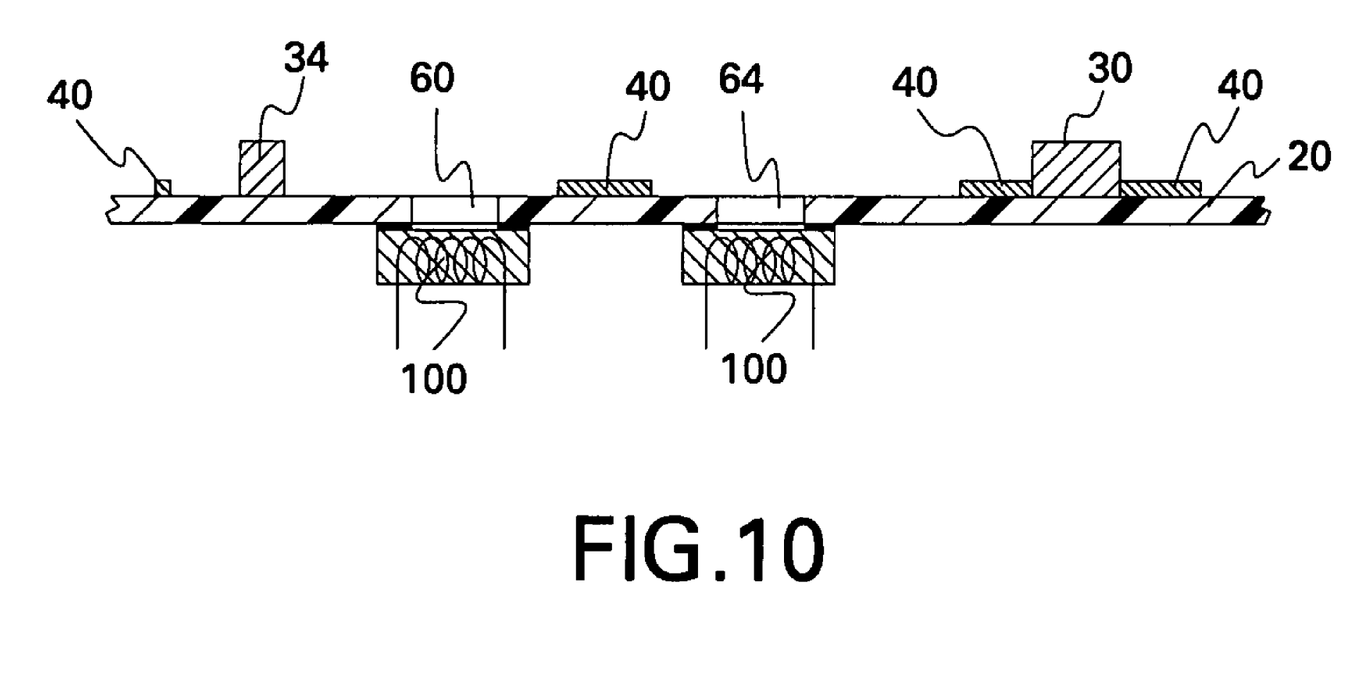
FIG. 10 shows schematically a flexible interconnect including heat sinks having cooling coils as an active cooling mechanism.

In one embodiment of the present invention, heat sink 100 can comprise a mechanism for active cooling. Active cooling can remove heat faster than cooling that relies on natural convection. A mechanism for active cooling can include heat pipes 104, mechanism to effect refrigeration, or mechanism that effects heat transport by the Peltier effect.

Figure 6:
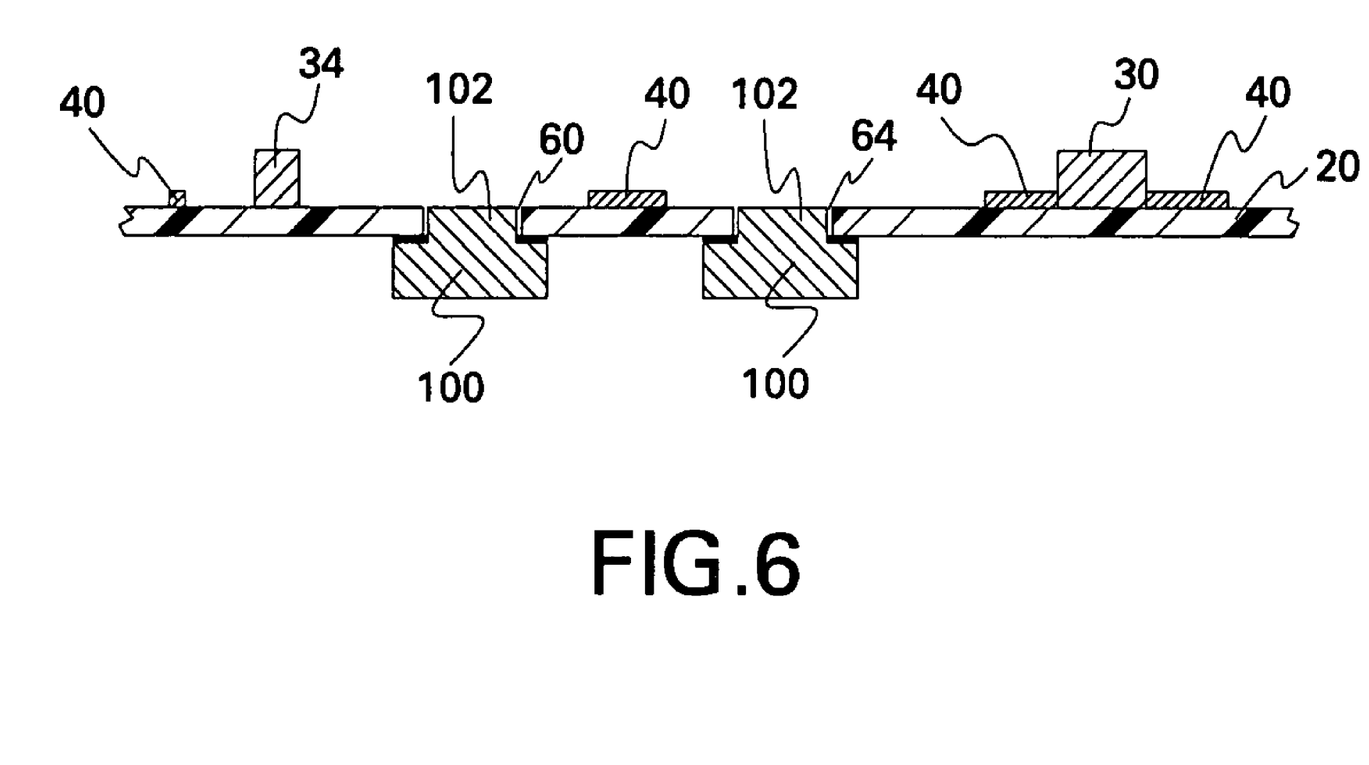
FIG. 6 shows another embodiment of the flexible interconnect with heat sinks extending through removed portions of the dielectric film.

In another embodiment of the present invention shown in FIG. 6, heat sink 100 has a protrusion 102 extending through a removed portion or hole 60, 64.

Figure 7:
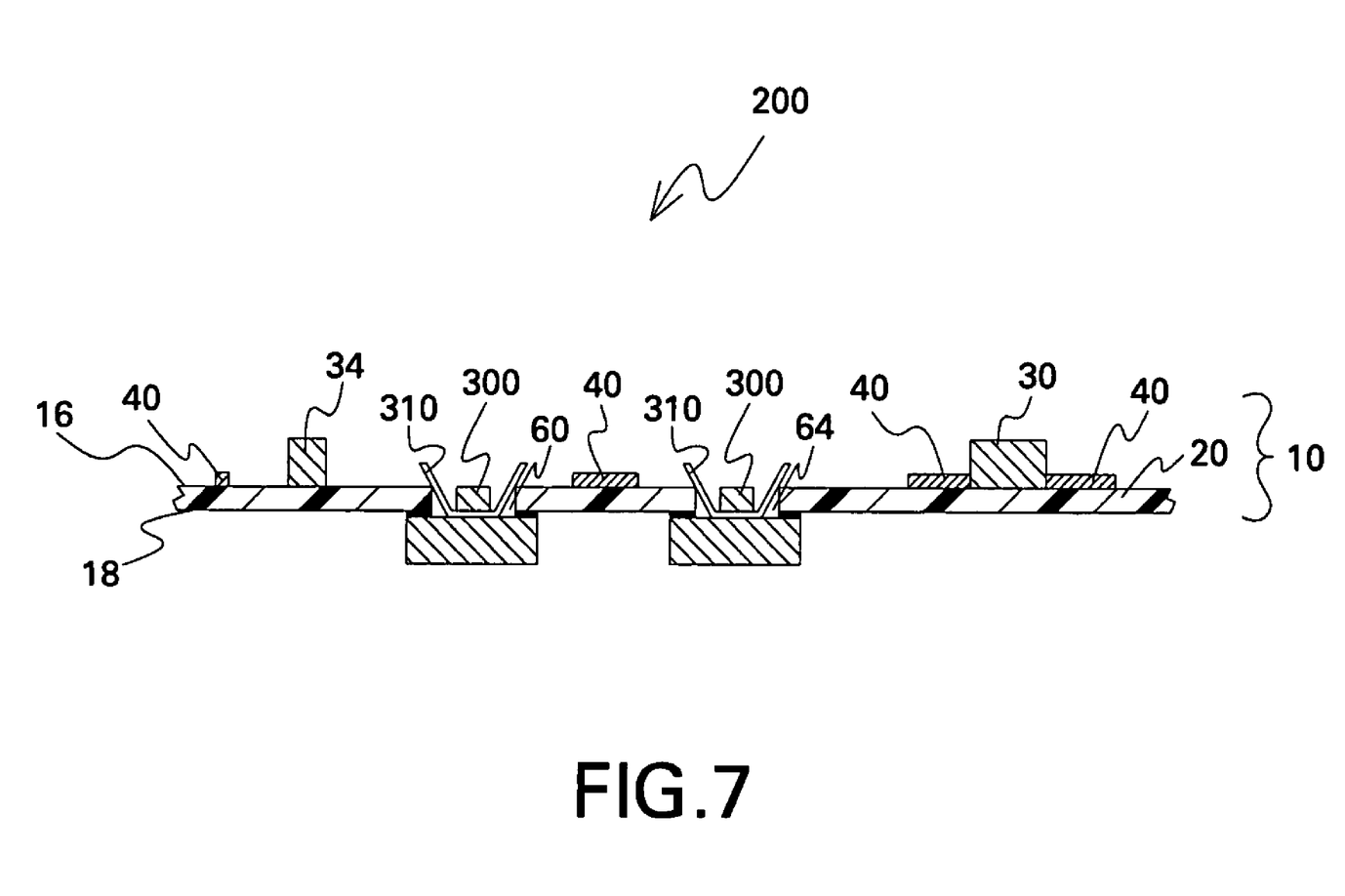
FIG. 7 shows schematically a LED-based electrical device of the present invention.
Figure 8:
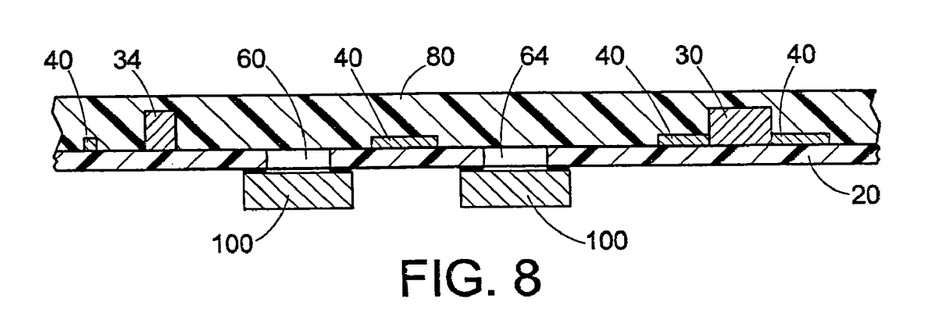
FIG. 8 shows schematically a flexible interconnect including heat sinks and a protective layer.
Figure 9:
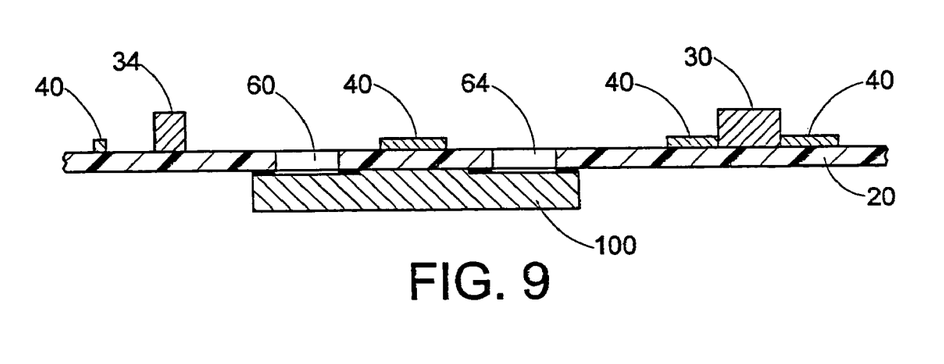
FIG. 9 shows schematically a flexible interconnect including a heat sink covering more than one removed portion.

In still another embodiment of the present invention, as shown in FIG. 7, an electrical device 200 comprising a flexible interconnect structure 10 and at least a LED 300. Flexible interconnect structure 10 comprises a flexible dielectric film 20 having a first surface 16 and a second surface 18, as is disclosed above. Flexible interconnect structure 10 supports electrical circuit components such as those shown by numerals 30 and 34 and circuit traces 40, which can participate in the operation of LED 300. At least a portion (60, 64) of flexible dielectric film 20 is removed through the thickness thereof. At least a heat sink 100 is attached to surface 18 of flexible interconnect structure 10 to cover a removed portion or hole (60, 64) thereof and is electrically isolated from circuit components 30 and 34 and circuit traces 40. LED 300 is attached to heat sink 100 and electrically connected to a circuit that comprises at least some of the circuit components and circuit traces by conventional methods in the art of LED packaging, such as soldering or wire bonding. Note that such electrical connections are not shown in FIG. 7. Typically, LED 300 is disposed in a reflective cup 310 of a reflective metal such as aluminum and is attached thereto by an electrically insulating, thermally conductive adhesive. Reflective cup 310 is typically attached to heat sink 100 with a thin layer of a thermally conducting adhesive, such as a mixture of an epoxy and metallic particles; such as copper, silver, or nickel particles. The entire electrical device 200 may be desirably disposed within a protective enclosure which comprises an optically transparent cover to allow light emitted from LED 300 to transmit therethrough and through which electrical power leads are provided. A wide range of LEDs emitting electromagnetic ("EM") radiation from the ultraviolet ("UV") to visible range can be used in an electrical device of the present invention. In one embodiment of the present invention, EM radiation emitted from LED 300 is converted to EM radiation having another wavelength by a photoluminescent material disposed in the vicinity of LED 300. For example, reflective cup 310 can be filled with a mixture of an optically transparent polymer resin and a photoluminescent material in particulate form. Alternatively, LED 300 may be painted with such a mixture, and reflective cup 310 is then filled with an optically transparent polymer resin.

The flexible interconnect structure of the present invention with its capability of rapid heat dissipation allows for the construction of LED-based electrical devices having complex shapes, such as those having sharp edges or small radii of curvature, that are not easily constructed with LEDs mounted on rigid printed circuit boards. For example, a heat sink in the form of a shaped structure of a thermally conductive material may be wrapped with a flexible interconnect structure of the present invention, and light-emitting elements selected from the group consisting of LEDs and LDs are disposed in contact with the heat sink so as to provide light in all directions. Such a shaped structure can have a curved surface or a surface that has sharp corners or edges. In fact, a flexible interconnect structure of the present invention is very suitable to be disposed on such shaped structures. Such a shaped heat sink may be a hollow structure that promotes efficient heat dissipation. Moreover, a mechanism for active cooling such as one of the mechanisms disclosed above may be disposed within the cavity of the hollow heat sink to further enhance the removal of heat from the light-emitting elements. Efficient heat dissipation with the design of flexible interconnect structures of the present invention allows for the application of higher power input to the LEDs resulting in devices with higher brightness and improved reliability and in many cases may reduce the total LED count needed for a system.

In one aspect of the present invention, a method is provided for making a LED-based electrical device that has the capability rapidly to dissipate heat generated by the LED. The method comprises providing a flexible dielectric film having a first surface and a second surface; disposing electrical circuit components and circuit traces on at least one of said surfaces; removing at least a portion of the dielectric film through its thickness such that the removed portion does not contain any circuit components or circuit traces; attaching at least a heat sink to one of the surfaces of the dielectric film such that the heat sink substantially covers the removed portion and is electrically isolated from at least one of the circuit components and at least one of the circuit traces; and attaching at least a LED to the heat sink through the removed portion of the dielectric film such that the LED is in substantial thermal contact with the heat sink and is electrically connected to at least one of the circuit traces. The material selection for and the method of fabricating various elements of the flexible interconnect structure comprising the circuit components and circuit traces are as disclosed above.

In another embodiment of the present invention, the method for making a LED-based electrical device comprises disposing at least a LED on a multilayer flexible interconnect structure that comprises a plurality of layers supporting electrical circuits and heat sinks covering portions of the flexible interconnect structure that have been removed to form removed portions or holes through which at least a LED is attached to the heat sinks. The multilayer flexible interconnect structure is formed by providing a plurality of flexible dielectric films, each having two opposed surface; forming at least a circuit on at least a surface of each of the flexible dielectric films, each circuit comprising interconnecting electrical circuit components and circuit traces; attaching the dielectric films having circuits formed thereon together with separation layers of electrically insulating materials, each separation layer being disposed between two of the dielectric films, the circuits on different dielectric films being connected together by metallic vias; removing portions of the multilayer flexible interconnect structure through its thickness to form the removed portions or holes; attaching heat sinks to an outer surface of the multilayer flexible interconnect structure; and attaching at least a LED through a removed portion to a heat sink to make a thermal contact therewith.

In still another embodiment of the present invention, the method comprises the steps of: (a) forming a multilayer stack by: (1) providing a flexible dielectric film; (2) forming a first electrical circuit on a surface thereof; (3) depositing a separation layer of an electrically insulating material on the electrical circuit; (4) forming a second electrical circuit on the exposed surface of the separation layer; (5) optionally repeating steps (3) and (4) as many times as desired to form a multilayer stack; (b) removing at least a portion of the multilayer stack through its entire thickness where no electrical components of the circuits are present to form a removed portion or hole; (c) attaching a heat sink to an outer surface of the multilayer stack substantially to cover the removed portion or hole; and (d) attaching at least a LED to a heat sink to make thermal contact therewith through a removed portion.

An electrical circuit of a method of the present invention can be formed by depositing at least one metallization layer on the underlying layer, then etching the metallization layer to form various electrical components. More than one layer may be deposited one on top of another to form certain electrical components such as capacitors or integrated circuits. Alternatively, the circuit can be formed by depositing materials through a mask disposed on the underlying layer.

In another aspect of the present invention, the LED is disposed in a reflective cup that is attached in thermal contact with the heat sink.

In still another aspect of the present invention, the reflective cup is filled with a mixture of a substantially transparent polymer resin and at least a photoluminescent material.

In still another aspect of the present invention, the method for making a LED-based electrical device of the present invention further comprises disposing the LED-based electrical device in a protective enclosure that comprises a substantially transparent cover disposed in the path of light emitted from the LED. The LED-based electrical device is used as light sources in automobiles, traffic signals, message boards, or displays.

While various embodiments are described herein, it will be appreciated from the specification that various combinations of elements, variations, equivalents, or improvements therein may be made by those skilled in the art, and are still within the scope of the invention as defined in the appended claims.

The invention claimed is:

1. A flexible interconnect structure comprising:
   a flexible dielectric film having two opposed surfaces, at least a portion of said dielectric film being removed through a thickness thereof, forming a plurality of removed portions;
   circuit traces disposed on at least one of said opposing surfaces, said removed portions being located where said circuit traces are not present; and
   a plurality of heat sinks coupled to a surface of said dielectric film, each of said plurality of heat sinks covering a corresponding one of a plurality of removed portions and less than one of said opposing surfaces of said flexible dielectric film, such that the interconnect structure remains flexible about at least two intersecting mutually perpendicular axes.

2. The flexible interconnect structure of claim 1, wherein said dielectric film comprises a flexible material that provides electrical isolation across a thickness of said dielectric film, said material being selected from the group consisting of thermoplastic polymers, acrylic resins, polyester, polyimide, and polyetherimide.

3. The flexible interconnect structure of claim 1, wherein said dielectric film has a thickness in a range from about 1 micrometer to about 5 mm.

4. The flexible interconnect structure of claim 1 further comprising at least one electrical circuit component selected from the group consisting of resistors, capacitors, inductors, integrated circuits, and power sources.

5. The flexible interconnect structure of claim 4 further comprising a dielectric protective layer disposed to cover said electrical circuit components and circuit traces.

6. The flexible interconnect structure of claim 1, wherein said plurality of heat sinks each comprise a thermally conductive material.

7. The flexible interconnect structure of claim 6, wherein said thermally conductive material is selected from the group consisting of metals and ceramics.

8. The flexible interconnect structure of claim 1, wherein said at least one of said heat sinks has fins extending away from said dielectric film.

9. The flexible interconnect structure of claim 1, wherein at least one of said heat sinks comprises heat pipes to carry heat away from an electrical component disposed thereon.

10. The flexible interconnect structure of claim 1, wherein at least one of said heat sinks comprises a mechanism for active cooling.

11. The flexible interconnect structure of claim 10, wherein said active cooling is effected by a mechanism selected from forced cooling, refrigeration, and heat transport by Peltier effect.

12. The flexible interconnect structure of claim 1, wherein at least one of said heat sinks covers a plurality of said removed portions.

13. The flexible interconnect structure of claim 1, wherein at least one of said plurality of heat sinks comprises a body made of a material selected from the group consisting of metals and ceramics.

14. The flexible interconnect structure of claim 1, further comprising:
a second flexible dielectric film having two opposed surfaces, at least a portion of said second dielectric film being removed through a thickness thereof, forming at least a removed portion;
circuit traces disposed on at least one of said surfaces of said second dielectric film;
electrically conducting connections between said circuit traces of said first and second flexible dielectric films; and
an electrically insulating layer disposed between said first and second flrexible dielectric films.

15. The flexible interconnect structure of claim 14, wherein an area of said at least a removed portion of said first dielectric film and an area of said at least a removed portion of said second dielectric film coincide, and a portion of said electrically insulating layer between said removed portion is removed.

16. The flexible interconnect structure of claim 1 in combination with at least a light-emitting element selected from the group consisting of light-emitting diode "LED"), laser diode ("LD"), and combinations thereof, said at least a light-emitting element being attached to at least one of said plurality of heat sinks in thermal contact therewith through said corresponding removed portion, said at least a light-emitting element being electrically connected to said circuit traces.

17. The combination of claim 16 wherein said at least a light-emitting element is disposed in a reflective cup that is attached to said at least one heat sink in thermal contact therewith through said corresponding removed portion.

18. The combination of claim 17 wherein said reflective cup contains a mixture of a substantially transparent resin and at least a photoluminescent material that is capable of absorbing a portion of a first electromagnetic ("EM") radiation emitted by said light-emitting element and converting said portion of said first EM radiation to a second EM radiation having a different wavelength range.

19. A flexible interconnect structure comprising:
a flexible dielectric film having two opposed surfaces, at least a portion of said dielectric film being removed through an entire thickness thereof, forming a plurality of removed portions;
circuit traces disposed on at least one of said opposing surfaces, said removed portions being located where said circuit traces are not present; and
a plurality of heat sinks coupled to a surface of said dielectric film, a first of said plurality of heat sinks covering at least one of said plurality of removed portions and less than one of said opposing surfaces of said flexible dielectric film, a second of said plurality of heat sinks covering at least one of said plurality of removed portions and less than one of said opposing surfaces of said flexible dielectric film, and a third of said plurality of heat sinks covering at least one of said plurality of removed portions and less than one of said opposing surfaces of said flexible dielectric film, the first heat sink being spaced from the second heat sink in a first direction and the first heat sink being spaced from the third heat sink in a second direction that is not parallel to the first direction.

20. The flexible interconnect structure of claim 19, wherein said dielectric film comprises a flexible material that provides electrical isolation across a thickness of said dielectric film, said material being selected from the group consisting of thermoplastic polymers, acrylic resins, polyester, polyimide, and polyetherimide.

21. The flexible interconnect structure of claim 19, wherein said dielectric film has a thickness in a range from about 1 micrometer to about 5 mm.

22. The flexible interconnect structure of claim 19 further comprising at least one electrical circuit component selected from the group consisting of resistors, capacitors, inductors, integrated circuits, and power sources.

23. The flexible interconnect structure of claim 22 further comprising a dielectric protective layer disposed to cover said electrical circuit components and circuit traces.

24. The flexible interconnect structure of claim 19, wherein said plurality of heat sinks each comprise a thermally conductive material.

25. The flexible interconnect structure of claim 24, wherein said thermally conductive material is selected from the group consisting of metals and ceramics.

26. The flexible interconnect structure of claim 19, wherein at least one of said heat sinks has fins extending away from said dielectric film.

27. The flexible interconnect structure of claim 19, wherein at least one of said heat sinks comprises heat pipes to carry heat away from an electrical component disposed thereon.

28. The flexible interconnect structure of claim 19, wherein at least one of said heat sinks comprises a mechanism for active cooling.

29. The flexible interconnect structure of claim 28, wherein said active cooling is effected by a mechanism selected from forced cooling, refrigeration, and heat transport by Peltier effect.

30. The flexible interconnect structure of claim 19, wherein at least one of said heat sinks covers a plurality of said removed portions.

31. The flexible interconnect structure of claim 19, wherein at least one of said plurality of heat sinks comprises a body made of a material selected from the group consisting of metals and ceramics.

32. The flexible interconnect structure of claim 19 in combination with at least a light-emitting element selected from the group consisting of light-emitting diode ("LED"), laser diode ("LD"), and combinations thereof, said at least a light-emitting element being attached to at least one of said plurality of heat sinks in thermal contact therewith through said corresponding removed portion, said at least a light-emitting element being electrically connected to said circuit traces.

33. The combination of claim 32, wherein said at least a light-emitting element is disposed in a reflective cup that is attached to said at least one heat sink in thermal contact therewith through said corresponding removed portion.

34. The combination of claim 33, wherein said reflective cup contains a mixture of a substantially transparent resin and at least a photoluminescent material that is capable of absorbing a portion of a first EM radiation emitted by said light-emitting element and converting said portion of said first EM radiation to a second EM radiation having a different wavelength range.

* * * * *